(12) United States Patent
Cocchini et al.

(10) Patent No.: US 10,172,244 B1
(45) Date of Patent: Jan. 1, 2019

(54) CONSTRUCTION OF PRINTED CIRCUIT BOARD HAVING A BURIED VIA

(71) Applicant: INTERNATIONAL BUSINESS MACHINES CORPORATION, Armonk, NY (US)

(72) Inventors: Matteo Cocchini, Long Island City, NY (US); Kyle I. Giesen, Beacon, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 15/975,726

(22) Filed: May 9, 2018

(51) Int. Cl.
| | | |
|---|---|---|
| *H05K 3/42* | (2006.01) | |
| *H05K 1/11* | (2006.01) | |
| *H05K 3/46* | (2006.01) | |
| *H05K 3/06* | (2006.01) | |

(52) U.S. Cl.
CPC .............. *H05K 3/421* (2013.01); *H05K 1/115* (2013.01); *H05K 3/06* (2013.01); *H05K 3/429* (2013.01); *H05K 3/4614* (2013.01); *H05K 2201/09536* (2013.01); *H05K 2201/09572* (2013.01); *H05K 2203/107* (2013.01)

(58) Field of Classification Search
CPC .................. H05K 3/421; H05K 3/429; H05K 2201/09572; H05K 2201/09536
USPC ......................................................... 174/263
See application file for complete search history.

(56) References Cited

U.S. PATENT DOCUMENTS

| | | | |
|---|---|---|---|
| 6,440,542 B1 * | 8/2002 | Kariya | H05K 3/0035 174/259 |
| 9,055,700 B2 | 6/2015 | Humphries et al. | |
| 2002/0170171 A1 * | 11/2002 | Miyazaki | H05K 3/462 29/831 |

(Continued)

FOREIGN PATENT DOCUMENTS

JP           2005123397 A      5/2005

OTHER PUBLICATIONS

C. Gabriel et al., "The dielectric properties of biological tissues: I. Literature survey", Phys. Med. Biol. 41 (1996) 2231-2249, all pages.

(Continued)

*Primary Examiner* — Sherman Ng
(74) *Attorney, Agent, or Firm* — Law Office of Ira D. Blecker, P.C.

(57) ABSTRACT

Method of constructing a printed circuit board, preferably with one lamination step: constructing multilayer cores wherein each multilayer core includes a sheet of cured dielectric material having a layer of metal on each side of the sheet of cured dielectric material; patterning each layer of metal to form wiring traces; forming a sheet of uncured dielectric material; embedding a solder element in the sheet of the uncured dielectric material; alternately stacking the multilayer cores with the sheets of uncured dielectric material, the sheet of the uncured dielectric material having the embedded solder element positioned so as to be aligned with wiring traces in adjacent layers of metal in adjacent multilayer cores; heating the solder element so as to cause the solder element to melt; and hot pressing the stack of multilayer cores and sheets of uncured dielectric material to cause curing of the sheets of uncured dielectric material.

16 Claims, 8 Drawing Sheets

(56) References Cited

U.S. PATENT DOCUMENTS

| | | | | |
|---|---|---|---|---|
| 2004/0104042 A1* | 6/2004 | Takase | ................ | H05K 3/0038 |
| | | | | 174/255 |
| 2007/0246254 A1* | 10/2007 | Kumar | ................ | H05K 3/4614 |
| | | | | 174/264 |
| 2016/0128201 A1 | 5/2016 | Ciufo et al. | | |
| 2016/0205765 A1 | 7/2016 | Takagi et al. | | |

OTHER PUBLICATIONS

K.M. Shurrab et al., "Simulation and Study of Temperature Distribution in Living Biological Tissues under Laser Irradiation", J Lasers Med Sci. 2014 Summer; 5(3): 135-139, all pages.
H. Mandavia, "Implementing Embedded Component from Concept-To-Manufacturing", 2014 IPC Apex Expo Conference Proceedings, Mar. 26, 2014, all pages.

\* cited by examiner

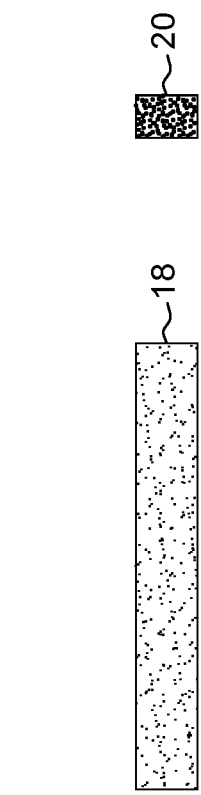
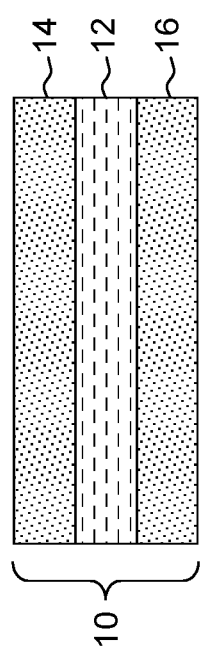
FIG. 1
FIG. 2
FIG. 3

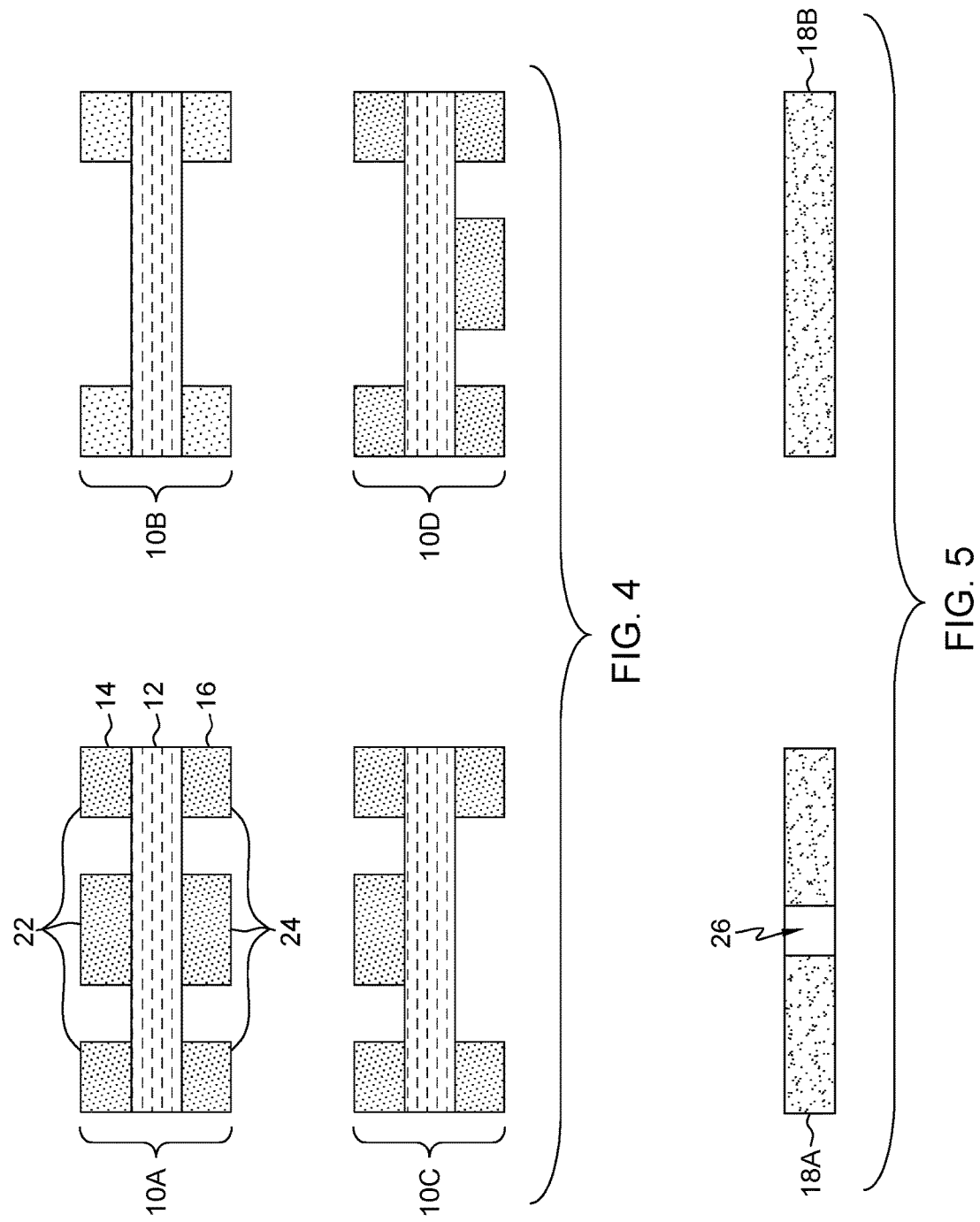

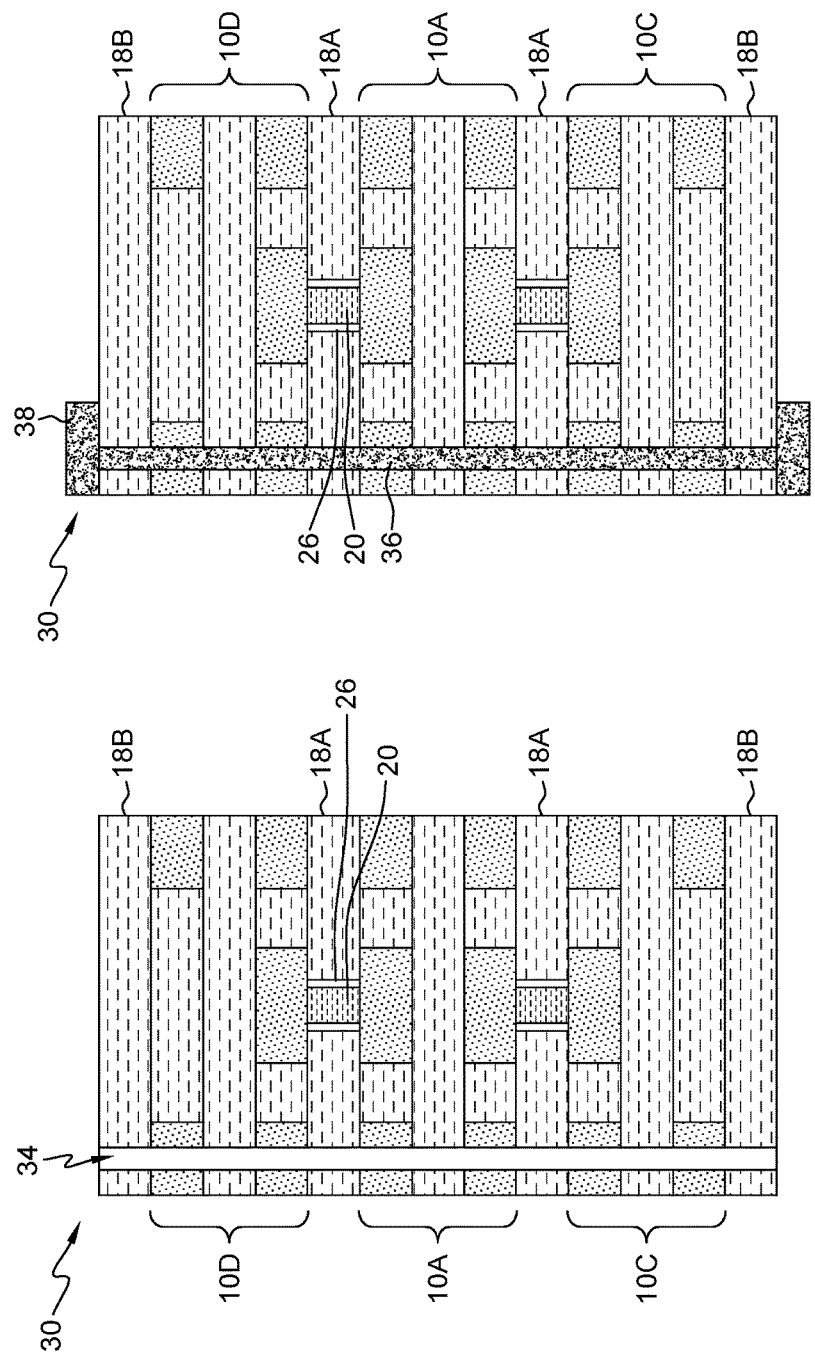

CONSTRUCTION OF PRINTED CIRCUIT BOARD HAVING A BURIED VIA

BACKGROUND

The present exemplary embodiments pertain to printed circuit boards and, more particularly, pertain to construction of printed circuit boards having buried vias in which the buried vias do not need to pass through multilayer cores and preferably construction of printed circuit boards by a single lamination step.

A multilayer printed circuit board may consist of many layers and may have both back and front metallization, typically referred to as circuit traces but also alternately including ground planes and other metallization structures. Vias provide an electrical current between layers in the printed circuit board. To create a via, holes may be drilled into the printed circuit board and the internal walls may be electroplated or otherwise metallized. Basic types of vias for a printed circuit board may include through vias that extend fully between outer surfaces of the printed circuit board, blind vias that penetrate to specified depth in the stack and stop, and buried vias that exist only in intermediate layers of the stack and are not accessible from outer surfaces.

BRIEF SUMMARY

The various advantages and purposes of the exemplary embodiments as described above and hereafter are achieved by providing, according to an aspect of the exemplary embodiments, a method of constructing a printed circuit board having a buried via comprising:
  constructing a plurality of multilayer cores wherein each multilayer core comprises a sheet of cured dielectric material having a layer of metal on each side of the sheet of cured dielectric material;
  patterning each layer of metal in the plurality of multilayer cores to form wiring traces in each layer of metal;
  forming a plurality of sheets of uncured dielectric material;
  embedding a solder element in at least one sheet of the uncured dielectric material;
  alternately stacking the plurality of multilayer cores with the plurality of sheets of uncured dielectric material between each multilayer core, the at least one sheet of the uncured dielectric material having the embedded solder element positioned so as to be aligned with wiring traces in adjacent layers of metal in adjacent multilayer cores;
  heating the solder element so as to cause the solder element to melt and create electrical continuity between the wiring traces; and
  hot pressing the stack of multilayer cores and sheets of uncured dielectric material to cause curing of the sheets of uncured dielectric material.

According to another aspect of the exemplary embodiments, there is provided a method of constructing a printed circuit board having a buried via comprising:
  constructing a plurality of multilayer cores wherein each multilayer core comprises a sheet of cured dielectric material having a layer of metal on each side of the sheet of cured dielectric material;
  patterning each layer of metal in the plurality of multilayer cores to form wiring traces in each layer of metal;
  forming a plurality of sheets of uncured dielectric material;
  embedding a solder element in at least one sheet of the uncured dielectric material;
  alternately stacking one of the plurality of multilayer cores with one of the plurality of sheets of uncured dielectric material,
  continuing alternately stacking one of the plurality of multilayer cores with one of the plurality of sheets of uncured dielectric material until a desired number of multilayer cores and sheets of uncured dielectric material have been stacked, the at least one sheet of the uncured dielectric material having the embedded solder element positioned so as to have the solder element be aligned with a first wiring trace in one multilayer core adjacent to the sheet of the uncured dielectric material having the embedded solder element with a second wiring trace in a second multilayer core adjacent to the sheet of the uncured dielectric material having the embedded solder element;
  heating the solder element so as to cause the solder element to melt and create electrical continuity between the first and second wiring traces; and
  hot pressing the stack of multilayer cores and sheets of uncured dielectric material to cause curing of the sheets of uncured dielectric material.

According to a further aspect of the exemplary embodiments, there is provided a printed circuit board comprising a plurality of multilayer cores wherein each multilayer core comprises a sheet of cured dielectric material having a layer of metal on each side of the sheet of cured dielectric material, each layer of metal formed to have wiring traces in each layer of metal and a layer of cured dielectric material between each pair of multilayer cores, at least one of the layers of cured dielectric material having an embedded solder element that forms a buried via between wiring traces on adjacent metal layers.

BRIEF DESCRIPTION OF SEVERAL VIEWS OF THE DRAWINGS

The features of the exemplary embodiments believed to be novel and the elements characteristic of the exemplary embodiments are set forth with particularity in the appended claims. The Figures are for illustration purposes only and are not drawn to scale. The exemplary embodiments, both as to organization and method of operation, may best be understood by reference to the detailed description which follows taken in conjunction with the accompanying drawings in which:

FIGS. 1 to 3 illustrate some components of the exemplary printed circuit boards where FIG. 1 illustrates a multilayer core, FIG. 2 illustrates a prepreg layer and FIG. 3 illustrates a solder element.

FIG. 4 illustrates several examples of a core which has been etched to remove portions of the metal layers in the cores.

FIG. 5 illustrates two types of prepreg layers, one of which has a perforation for receiving a solder element.

FIGS. 6 to 13 illustrate an exemplary process for constructing a printed circuit board having buried vias in which:

FIG. 6 illustrates cores which have been stacked at an early stage of forming a printed circuit board with prepreg layers interspersed between the cores.

FIG. 7 illustrates heating of the solder elements to cause melting of the solder elements and create electrical continuity between metal traces of the cores through the melted solder elements.

FIG. 8 illustrates the solder elements after the heating step in FIG. 5.

FIG. 9 illustrates a hot press for applying heat and pressure to the printed circuit board stack.

FIG. 10 illustrates the printed circuit board after removal from the hot press in which the prepreg layers have been pushed into the gaps between the wiring traces in the metal layers and cured so that all of the dielectric in the printed circuit board is now cured.

FIG. 11 illustrates an optional second heating step to melt the solder elements.

FIG. 12 illustrates the formation of a through via hole in the printed circuit board.

FIG. 13 illustrates the metallizing of the through via hole to form a through via and metallizing of the top and bottom of the printed circuit board to form microstrip features.

DETAILED DESCRIPTION

Figure 7:
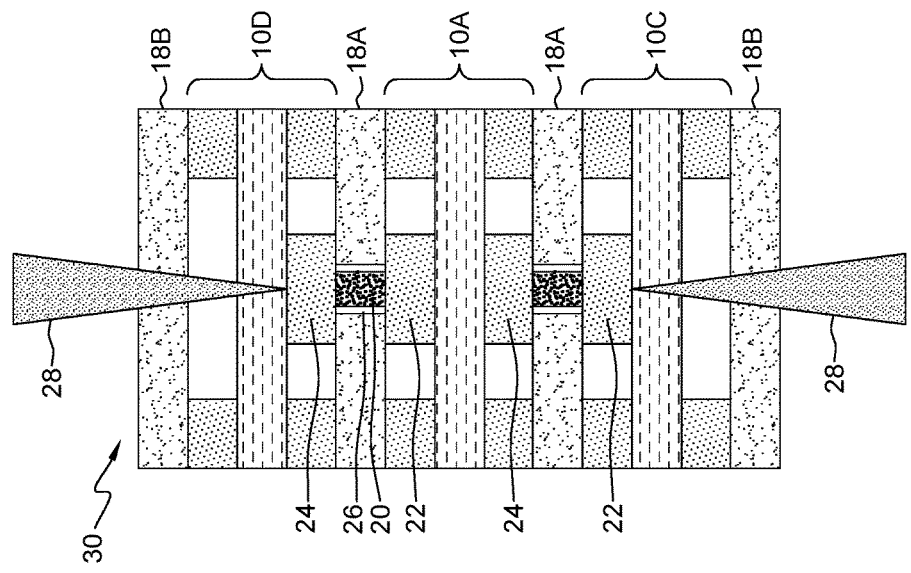

The exemplary embodiments are concerned with the formation of buried vias in multilayer printed circuit boards.

The exemplary embodiments have a number of benefits. One benefit is that multilayer printed circuit boards having buried vias may be constructed with a single lamination step. Other benefits are:

The exemplary embodiments reduce the number of lamination steps, hence significantly reducing cost of the printed circuit board due to time savings.

The process for buried via construction in the exemplary embodiments is simplified which potentially reduces the risk of errors and contamination.

The process for buried via construction in the exemplary embodiments does not require the buried via must pass through a core but a prepreg pass through is required.

In the exemplary embodiments, you can make a one layer jump through prepreg and between cores without multiple plating and lamination stages.

In the exemplary embodiments, you can overlap buried vias in different layers.

FIGS. 1 to 3 illustrate some components of the exemplary printed circuit boards. FIG. 1 illustrates a multilayer core 10 which may include a cured dielectric layer 12 sandwiched between a first metal layer 14 and a second metal layer 16. The multilayer core 10 may be formed in sheets approximating the size of the finished printed circuit board or may be larger and then cut to size.

Materials for the dielectrics used in the exemplary printed circuit boards may include any material having a relative permativity ($\epsilon_R$) of about 3.2 to 4.8. One example of a suitable dielectric may be a resin-glass weave, one example of which is FR4 that comprises a woven fiberglass cloth with an epoxy resin binder. Another example of a dielectric may be a resin such as ceramic filled PTFE composites (available from Rogers Corporation Chandler, Ariz.).

The metals that comprise the metal layers 14, 16 may be copper but in alternative embodiments may be gold, nickel or a gold-nickel alloy.

FIG. 2 illustrates an uncured dielectric sheet 18 which may be cured during the formation of the printed circuit board. The uncured dielectric sheet 18 may also be referred to as prepreg layer 18.

FIG. 3 illustrates a solder element 20 which may be embedded in the prepreg layer 18 during the formation of the printed circuit board. The solder element 20 may be a homogeneous solder alloy preform which may contain a flux. The solder element 20 may also be a solder paste preform containing the various elements of the solder alloy, but not previously melted, and a binder which may also be the flux. The solder composition should have a liquidus temperature of about 100 to 118° C. Alloys meeting this requirement may be an indium-tin alloy (52% In, 48% Sn (% by mass)) having a liquidus temperature of 118° C., an indium-tin-zinc alloy (52.2% In, 46% Sn, 1.8% Zn (% by mass)) having a liquidus temperature of 108° C. and a bismuth-indium alloy (67% Bi, 33% In (% by mass)) having a liquidus temperature of 109° C.

FIG. 4 illustrates a core 10 which has been etched to remove portions of the metal layers 14, 16 to form wiring traces 22, 24. The wiring traces 22, 24 may carry signal, power and ground within each of the metal layers 14, 16.

The core 10 may vary from layer to layer, depending on the wiring requirements. FIG. 4 illustrates examples of four different cores, 10A, 10B, 10C and 10D in which the wiring on cured dielectric layer 12 may vary. There may be other forms of cores 10 as well.

Electrical conductivity between wiring layers may be achieved by through vias, blind vias and buried vias as described previously. The process by which blind vias are constructed are part of the exemplary embodiments.

FIG. 5 illustrates two types of prepreg layers 18. Prepreg layer 18A has a perforation 26 which may be formed, for example, by drilling. Perforation extends entirely through the prepreg layer 18A. During the construction of the printed circuit board, a solder element 20 may be placed in perforation 26. Prepreg layer 18B has no such perforation. As noted previously, the prepreg layers 18A, 18B comprise uncured dielectric which becomes cured during a hot pressing process discussed hereafter.

Figure 6:
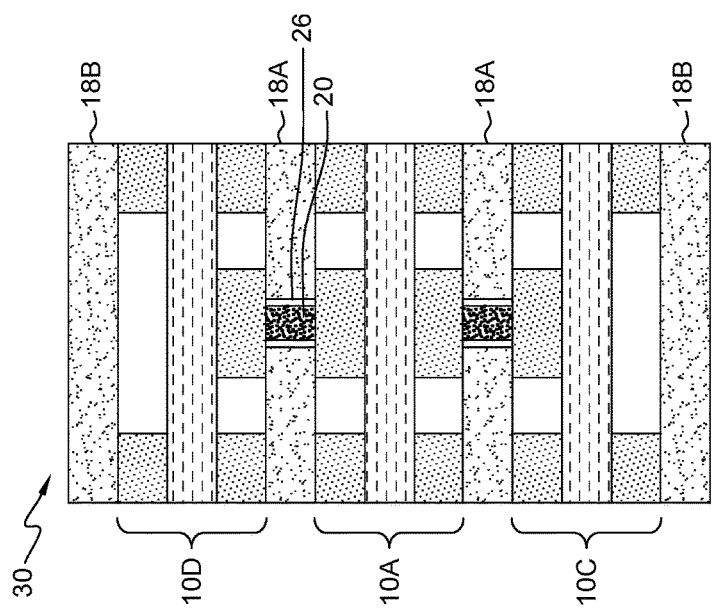

Referring now to FIGS. 6 to 13, there is illustrated one exemplary embodiment of constructing a printed circuit board having a buried via. In FIG. 6, cores 10 have been stacked as an early stage of forming a printed circuit board with prepreg layers interspersed between the cores. The cores 10 illustrated in FIG. 6 are three examples of the cores illustrated in FIG. 4 and include core 10A, core 10C and core 10D. In the particular printed circuit board illustrated in FIGS. 6 to 13, the printed circuit board design does not call for a core such as core 10B illustrated in FIG. 4.

On top of multilayer core 10D may be placed prepreg layer 18B. Between multilayer core 10D and multilayer core 10A may be placed a prepreg layer 18A into which has been inserted solder element 20. Similarly, between multilayer core 10A and multilayer core 10C may be placed another prepreg layer 18A into which has been inserted solder element 20.

On the bottom of the stack is another prepreg layer 18B.

The stack of multilayer cores 10A, 10C, 10D and prepreg layers 18A, 18B and solder elements 20 may be generally indicated as printed circuit board 30.

It should be understood that three multilayer cores 10 have been shown in FIG. 6 and subsequent Figures for the purpose of illustration and not limitation. The stack for a printed circuit board may contain more or less than the three cores. Also, FIG. 6 and subsequent Figures show only two solder elements 20 for the purpose of illustration and not limitation. In practice, there may be many more than two solder elements 20 within printed circuit board 30 including multiple solder elements 20 within each prepreg layer 18A in printed circuit board 30. Finally, FIG. 6 and subsequent Figures show the solder elements 20 being vertically aligned for the purpose of illustration and not limitation. As there is expected in practice to be many more solder elements, it is expected that there may not be vertical alignment between the solder elements 20. The solder elements 20 in various layers may be spaced horizontally with respect to the solder element above or below and may even overlap.

Referring now to FIG. 7, the solder elements 20 may be heated to cause melting of the solder elements 20 and create electrical continuity between the metal traces 22, 24 through the melted solder elements 20. Upon removal of the heat source, the solder elements 20 will solidify. In one embodiment, the entire stack may be heated. However, as the dielectric layers are insulators, heating of the entire stack is not preferred because undesirably high temperatures may be needed to input enough heat to melt the solder elements 20.

More preferably, the solder elements 20 are locally heated by a laser. The laser may be any laser that can have a focal point of about 2 mm±0.5 mm and is capable of providing enough heat to melt the solder elements 20. That is, the laser should be capable of heating an area impinged by the focal point of the laser to about 118° C. or greater. Upon removal of the laser, the solidified solder elements 20 form the buried vias.

The solder elements 20 may only be indirectly heated by the laser. That is, FIG. 7 shows one laser 28 which is focused on the wiring trace 24 in core 10D. The heat generated in wiring trace 24 is conducted by the wiring trace 24 to the upper solder element in dielectric layer 18A. FIG. 7 shows another laser 28 which is focused on the wiring trace 22 in core 10C. The heat generated in wiring trace 22 is conducted by the wiring trace 22 to the lower solder element in dielectric layer 18A. To facilitate the laser heating of the wiring traces 22, 24, where the laser 28 is expected to impinge on the wiring traces 22, 24, the wiring traces 22, 24 may be enlarged to form a pad.

Since the lasers 28 may penetrate through dielectric but not metal, there should be no metal layers between the lasers 28 and the wiring trace that is meant to be heated. For example, the only wiring traces between the lasers 28 and the solder elements 20 that are to be melted are wiring trace 24 in core 10D and wiring trace 22 in core 10C.

Figure 8:
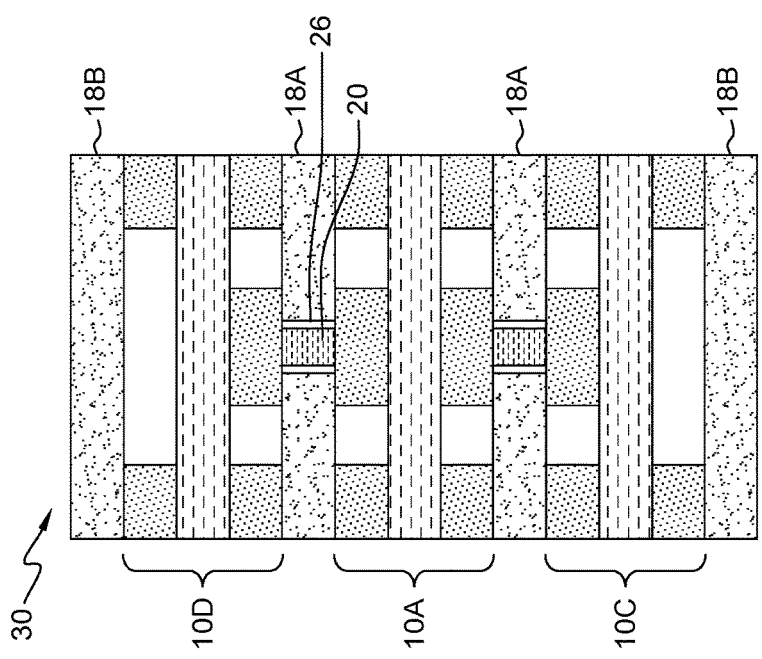

The printed circuit board 30 as shown in FIG. 8 has been previously exposed to the heating in FIG. 7 and solder elements 20 have been melted and resolidified. The solder elements 20 in FIG. 8 may entirely fill the perforations 26 in prepreg layers 18A or there may be a small gap between the solder elements 20 and the prepreg layers 18A as shown in FIG. 8. In general, the solder elements 20 should fit snugly within prepreg layers 18A.

Figure 9:
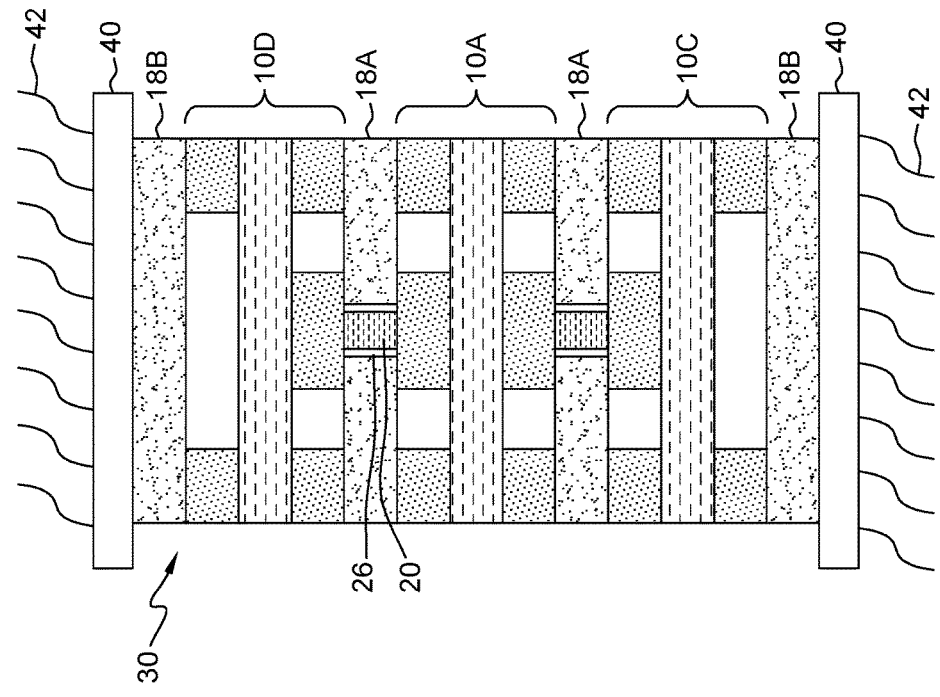

Referring now to FIG. 9, the printed circuit board 30 in FIG. 8 has been put in a hot press and heat and pressure have been applied. For purposes of illustration and not limitation, the hot press may be a vacuum press or a press comprising two heated plates. FIG. 9 illustrates a hot press comprising two plates 40 which are heated 42 by a heat source. The hot press should be heated to about 300 to 400° C. and about 400 pounds per square inch (psi) of pressure applied.

A benefit of the preferred exemplary embodiments is that the heat and pressure may be applied only once to accomplish lamination of the printed circuit board 30 in a single lamination step. The lamination of previous printed circuit boards may have required multiple lamination steps.

Figure 10:
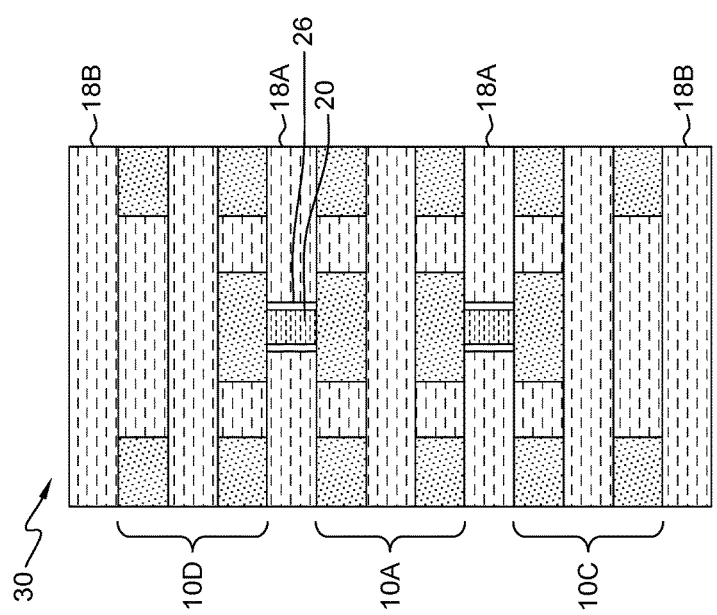

Referring now to FIG. 10, as a result of the hot pressing illustrated in FIG. 9, the prepreg layers 18A, 18B have been pushed into the gaps between the wiring traces in the metal layers 14, 16 and cured so that all of the dielectric in the printed circuit board 30 is now cured.

Figure 11:
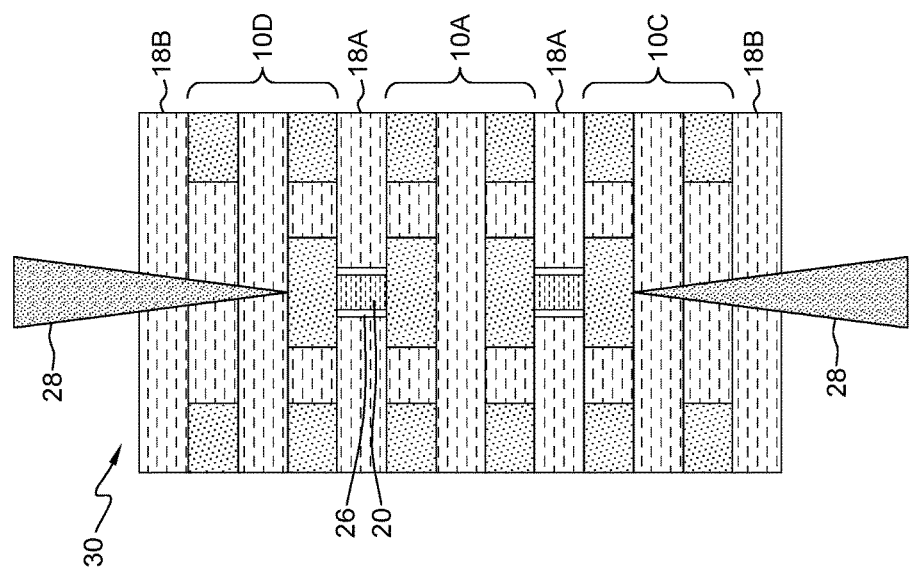

It is possible that during hot pressing, one or more of the solder elements 20 that form the buried vias may become cracked or misaligned which may adversely affect the electrical continuity of the solder elements 20. In one preferred exemplary embodiment, the solder elements 20 may be locally heated by a laser 28 as shown in FIG. 11 to remelt the solder elements 20 and heal those solder elements 20 that may be misaligned or cracked so as to restore electrical continuity. After removal of the laser heat source, the solder elements would solidify.

Referring now to FIG. 12, a through via 34 opening has been formed, for example, by drilling, to extend from the top to the bottom of the printed circuit board 30.

Referring now to FIG. 13, the through via opening 34 has been metallized, for example, by plating the walls of the through via opening 34 to form through via 36. The top and bottom of the printed wiring board 30 may also be metallized, for example by plating, to form microstrip features 38 on the top and bottom of the stack 30 in electrical contact with the through via 36.

Figure 14:
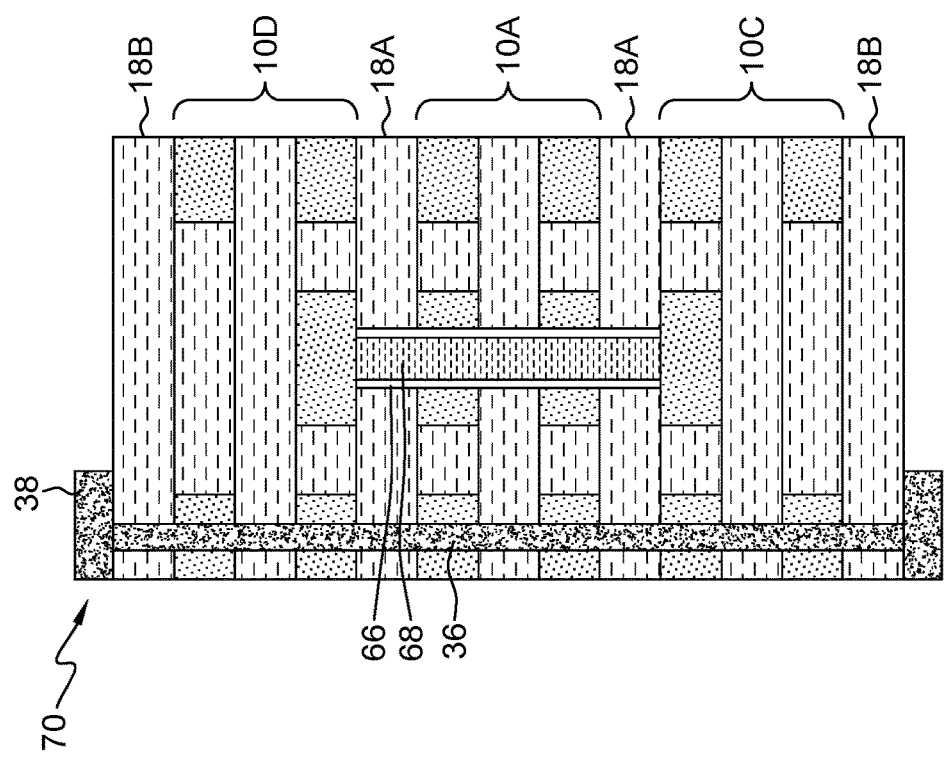
FIG. 14 is another exemplary embodiment of a printed circuit board in which the solder element extends through a core.

Referring now to FIG. 14, another exemplary embodiment of a printed circuit board 70 is illustrated. In the prior exemplary embodiment of printed circuit board 30, the perforations 26 and solder elements 20 were only in the dielectric layers 18A and did not extend through any of the cores 10. In the exemplary embodiment of printed circuit board 70 illustrated in FIG. 14, the perforation 66 and solder core 68 extend through one or more cores 10 and one or more dielectric layers 18A. As illustrated in FIG. 14, the perforation 66 and solder core 68 extend through core 10A and dielectric layers 18A.

Figure 15:
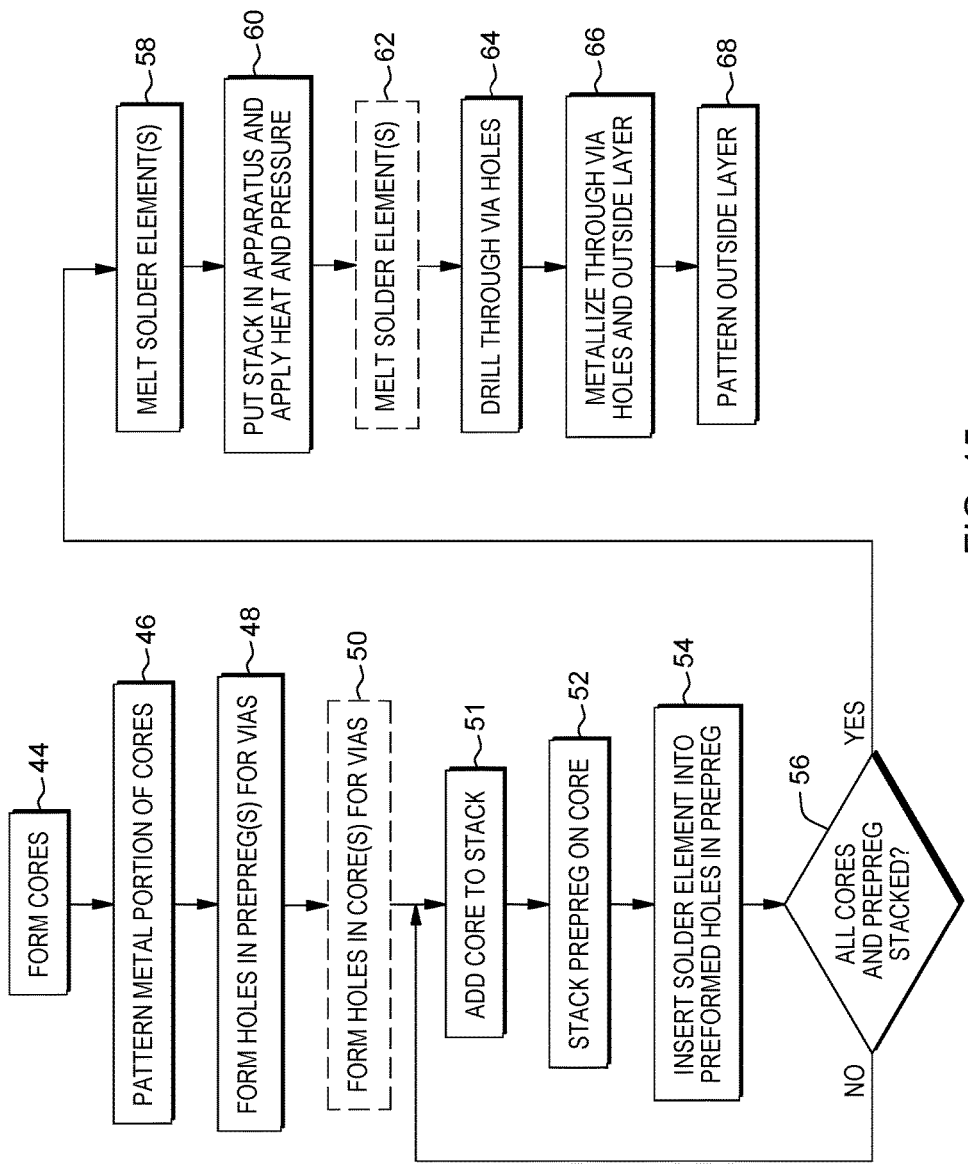
FIG. 15 is a flow chart for a method for constructing a printed circuit board having buried vias.

FIG. 15 illustrates an exemplary embodiment of a method of constructing a printed circuit board having buried vias.

In a first step of the method, cores are formed, box 44. These cores may be, for example, the cores illustrated in FIG. 1.

The metal portions of the cores may be patterned to form wiring traces, box 46. The patterning of the cores may take the form of any of the cores disclosed in FIG. 4 or described with respect to FIG. 4.

Holes may be formed in one or more of the prepregs, box 48. The prepregs having the holes formed may be the prepregs such as prepreg 18A illustrated in FIG. 5.

With respect to the embodiment illustrated in FIG. 14, it may also be necessary to form holes in one or more of the cores, box 50. This step may not be required for the exemplary printed circuit board 30 illustrated in FIGS. 6 to 13.

The stacking process may begin by adding a core to the stack, box 51, and then stacking a layer of prepreg on the core, box 52. The prepreg may be, for example, either of the prepregs 18A or 18B illustrated in FIG. 5. If the core is the first core to be added to the stack, there may be an initial placement of a prepreg layer, such as prepreg layer 18B, upon which the first core may be stacked.

For those prepregs having apertures for receiving a solder element, a solder element is inserted in each aperture, box 54. For example, a solder element 20 illustrated in FIG. 3 may be inserted in aperture 26 in prepreg 18A illustrated in FIG. 5.

After each layer of prepreg is stacked on a core, including inserting any required solder element in the prepreg, decision block 56 is reached. If additional cores and/or prepregs are required, the "NO" path is followed back to box 51 to add a core.

If additional cores and/or prepregs are not required, the "YES" path is followed to melt the solder elements in each aperture, box 58. Melting of the solder elements was illustrated in FIG. 7 where lasers 28 were used to locally heat the wiring traces which caused melting of the solder elements.

Next, the printed circuit board stack may be placed in an apparatus to apply heat and pressure, box 60. One example of the apparatus to apply heat and pressure is the hot press illustrated in FIG. 9.

As noted previously, the process of applying heat and pressure may cause cracks or misalignment of the solder elements. Optionally then, a second heating process, preferably by localized heating, may proceed to heat any defects in the solder elements, box 62. FIG. 11 illustrates this additional heating process where lasers 28 again provide localized heating to melt the solder elements.

Through via holes may be drilled through the printed circuit board stack, box 64. One such though via hole 34 is illustrated in FIG. 12.

The though via holes may be metallized and an outside layer may be formed on the printed circuit board stack, box 66, followed by patterning the outside layer, box 68. FIG. 13 illustrates the metallizing of the through via hole to form a through via 36. FIG. 13 additionally illustrates the outside layer that has been patterned to form microstrip features 38.

It will be apparent to those skilled in the art having regard to this disclosure that other modifications of the exemplary embodiments beyond those embodiments specifically described here may be made without departing from the spirit of the invention. Accordingly, such modifications are considered within the scope of the invention as limited solely by the appended claims.

What is claimed is:

1. A method of constructing a printed circuit board having a buried via comprising: constructing a plurality of multilayer cores wherein each multilayer core comprises a sheet of cured dielectric material having a layer of metal on each side of the sheet of cured dielectric material; patterning each layer of metal in the plurality of multilayer cores to form wiring traces in each layer of metal; forming a plurality of sheets of uncured dielectric material; embedding a solder element in at least one sheet of the uncured dielectric material; alternately stacking the plurality of multilayer cores with the plurality of sheets of uncured dielectric material between each multilayer core, the at least one sheet of the uncured dielectric material having the embedded solder element positioned so as to be aligned with wiring traces in adjacent layers of metal in adjacent multilayer cores; heating the solder element so as to cause the solder element to melt and create electrical continuity between the wiring traces; and hot pressing the stack of multilayer cores and sheets of uncured dielectric material to cause curing of the sheets of uncured dielectric material, wherein after hot pressing, locally heating the solder element to cause the solder element to melt.

2. The method of claim 1 further comprising: forming a through via hole through the stack of multilayer cores and sheets of cured dielectric material; and metallizing the through via hole.

3. The method of claim 2 wherein locally heating the solder element is between the steps of hot pressing and forming a through via hole.

4. The method of claim 1 wherein heating the solder element is locally heating the solder element by a laser.

5. The method of claim 1 wherein the metal is copper.

6. The method of claim 1 wherein the composition of the solder element is selected from the group consisting of indium-tin, indium-tin-zinc and bismuth-indium alloys.

7. The method of claim 1 wherein the solder element has a liquidus temperature of 100° C. to 118° C.

8. The method of claim 1 wherein the solder element comprises solder and a flux.

9. The method of claim 1 wherein embedding the solder element in the at least one sheet of the uncured dielectric material is only in the at least one sheet of the uncured dielectric material and not in the adjacent multilayer cores.

10. The method of claim 1 wherein embedding the solder element in the at least one sheet of the uncured dielectric material further comprises embedding the solder element in the wiring traces in each layer of metal and in the sheet of cured dielectric material of at least one of the adjacent multilayer cores.

11. A method of constructing a printed circuit board having a buried via comprising: constructing a plurality of multilayer cores wherein each multilayer core comprises a sheet of cured dielectric material having a layer of metal on each side of the sheet of cured dielectric material; patterning each layer of metal in the plurality of multilayer cores to form wiring traces in each layer of metal; forming a plurality of sheets of uncured dielectric material; embedding a solder element in at least one sheet of the uncured dielectric material; alternately stacking one of the plurality of multilayer cores with one of the plurality of sheets of uncured dielectric material, continuing alternately stacking one of the plurality of multilayer cores with one of the plurality of sheets of uncured dielectric material until a desired number of multilayer cores and sheets of uncured dielectric material have been stacked, the at least one sheet of the uncured dielectric material having the embedded solder element positioned so as to have the solder element be aligned with a first wiring trace in one multilayer core adjacent to the sheet of the uncured dielectric material having the embedded solder element with a second wiring trace in a second multilayer core adjacent to the sheet of the uncured dielectric material having the embedded solder element; heating the solder element so as to cause the solder element to melt and create electrical continuity between the first and second wiring traces; and hot pressing the stack of multilayer cores and sheets of uncured dielectric material to cause curing of the sheets of uncured dielectric material, wherein after hot pressing, locally heating the solder element to cause the solder element to melt.

12. The method of claim 11 wherein the solder element has a liquidus temperature of 100° C. to 118° C.

13. The method of claim 11 wherein embedding the solder element in the at least one sheet of the uncured dielectric material is only in the at least one sheet of the uncured dielectric material and not in the adjacent first and second multilayer cores.

14. The method of claim 11 wherein embedding the solder element in the at least one sheet of the uncured dielectric material further comprising embedding the solder element in the wiring traces in each layer of metal and in the sheet of cured dielectric material of at least one of the adjacent multilayer cores.

15. A printed circuit board comprising a plurality of multilayer cores wherein each multilayer core comprises a sheet of cured dielectric material having a layer of metal on each side of the sheet of cured dielectric material, each layer of metal formed to have wiring traces in each layer of metal and a layer of cured dielectric material between each pair of multilayer cores, at least one of the layers of cured dielectric material having an embedded solder element that forms a buried via between wiring traces on adjacent metal layers, wherein embedding the solder element in the at least one sheet of the cured dielectric material further comprises embedding the solder element in the wiring traces in each layer of metal and in the sheet of cured dielectric material of at least one of the adjacent multilayer cores.

16. The printed circuit board of claim 15 wherein the solder element has a liquidus temperature of 100° C. to 118° C.

* * * * *